(12) United States Patent
Koyama

(10) Patent No.: US 7,677,941 B2
(45) Date of Patent: Mar. 16, 2010

(54) ELECTRONIC DEVICE SUBSTRATE, ELECTRONIC DEVICE, METHOD OF MANUFACTURING ELECTRONIC DEVICE, AND ELECTRONIC APPARATUS

(75) Inventor: Minoru Koyama, Matsumoto (JP)

(73) Assignee: Seiko Epson Corporation (JP)

( * ) Notice: Subject to any disclaimer, the term of this patent is extended or adjusted under 35 U.S.C. 154(b) by 503 days.

(21) Appl. No.: 11/365,896

(22) Filed: Feb. 27, 2006

(65) Prior Publication Data

US 2006/0220541 A1     Oct. 5, 2006

(30) Foreign Application Priority Data

Mar. 30, 2005  (JP) .............................. 2005-097564

(51) Int. Cl.
*H01J 9/00*   (2006.01)

(52) U.S. Cl. ............................... 445/24; 445/26; 445/60

(58) Field of Classification Search ................. 427/558; 349/190; 359/237; 313/582–586; 148/1.5; 445/24–25, 60
See application file for complete search history.

(56) References Cited

U.S. PATENT DOCUMENTS

| | | | | |
|---|---|---|---|---|
| 4,187,124 | A * | 2/1980 | Muller et al. ................. | 438/62 |
| 6,679,747 | B1 * | 1/2004 | Chen et al. ..................... | 445/60 |
| 6,791,660 | B1 * | 9/2004 | Hayashi et al. ............. | 349/190 |
| 6,852,372 | B2 * | 2/2005 | Horikoshi et al. ........... | 427/558 |
| 6,859,296 | B2 * | 2/2005 | Kawase ..................... | 359/237 |
| 7,326,460 | B2 | 2/2008 | Hirai | |
| 7,431,770 | B2 | 10/2008 | Watanabe | |
| 2004/0119410 | A1 * | 6/2004 | Jun et al. ..................... | 313/582 |
| 2004/0131782 | A1 | 7/2004 | Hasei | |
| 2004/0178726 | A1 * | 9/2004 | Yamagata et al. ........... | 313/506 |
| 2007/0082144 | A1 | 4/2007 | Hasei et al. | |

FOREIGN PATENT DOCUMENTS

| | | |
|---|---|---|
| CN | 1501436 | 6/2004 |
| CN | 1516527 | 7/2004 |
| JP | 08-330594 | 12/1996 |
| JP | 10-133229 | 5/1998 |
| JP | 2001-313164 | 11/2001 |
| JP | 2003-330042 | 11/2003 |
| JP | 2004-47179 | 2/2004 |
| JP | 2004-306191 | 11/2004 |
| JP | 2004-311957 | 11/2004 |
| KR | 10-2005-0023035 | 3/2005 |

OTHER PUBLICATIONS

English Translation of JP 10-133229 A, cited in applicant's IDS.*

* cited by examiner

*Primary Examiner*—Nimeshkumar D. Patel
*Assistant Examiner*—Mary Ellen Bowman
(74) *Attorney, Agent, or Firm*—Harness, Dickey & Pierce, P.L.C.

(57) ABSTRACT

An electronic device substrate includes an insulating plate base, an electronic circuit formed on one surface of the base, and a conductive film formed on the other surface of the base and having electrical conductivity. The electronic device substrate is completed through a manufacturing process including charge-removal movement in which removal of a charge of the base is combined with movement of the electronic device substrate. In the charge-removal movement, the electronic device substrate is moved with being supported by a substrate support part that has electrical conductivity and is grounded. The substrate support part abuts the conductive film during the charge-removal movement.

17 Claims, 11 Drawing Sheets

ELECTRONIC DEVICE SUBSTRATE, ELECTRONIC DEVICE, METHOD OF MANUFACTURING ELECTRONIC DEVICE, AND ELECTRONIC APPARATUS

BACKGROUND

1. Technical Field

The present invention relates to an electronic device substrate, an electronic device, a method of manufacturing an electronic device, and an electronic apparatus.

2. Related Art

In order to enhance the yield and quality of products in fabrication of electronic device substrates, the improvement in manufacturing apparatuses for the electronic device substrates is being promoted. The electronic device substrates are typified by e.g. organic electro-luminescence (EL) panels, and particularly by active-matrix organic EL panels employing thin-film transistors (TFTs) as switching elements.

The manufacturing of the electronic device substrates involves the following problem: static electricity arising due to charging of the electronic device substrate in the manufacturing process thereof leads to breakdown of elements such as TFTs and absorption of dusts in the air to the substrate, which lowers the yield and quality of products. In recent years, the size of glass substrates, which are used as a base of the electronic device substrate, is being increased for lowering fabrication costs and improving the yield. This substrate size increase causes an increase of the total charging amount in the glass substrate, which is an insulator. Therefore, the above-described problem is getting more serious.

A technique is disclosed to prevent the charging of a glass substrate during the manufacturing process. In this technique, the glass substrate is supported by grounded conductive members during the transfer of the glass substrate. For example, JP-A-10-133229 discloses this technique.

However, the availability of the technique in this patent document is insufficient to prevent charging of recent large-size glass substrates.

In addition, in current electronic apparatuses, sufficient measures for achieving electro-magnetic compatibility (EMC) need to be ensured, in order to prevent the electronic apparatus from inhibiting the operation of other electronic apparatuses due to interference of electromagnetic waves and electric fields, and vice versa to prevent other electronic apparatuses from inhibiting the normal operation of the electronic apparatus. Therefore, the casing of some electronic devices is provided with a shield for blocking electromagnetic waves and electric fields. This shield needs to be coupled to the ground of an electronic circuit on the electronic device substrate. However, since a configuration for coupling the shield with the ground of the electronic circuit on the electronic device substrate needs to be formed, the number of parts and manufacturing steps increases, which problematically rises manufacturing costs.

SUMMARY

An advantage of some aspects of the invention is to provide an electronic device substrate that allows improvement of its yield and quality by preventing adverse effects due to static electricity in its manufacturing process.

Another advantage of some aspects of the invention is to provide an electronic device substrate, an electronic device, a method of manufacturing an electronic device, and an electronic apparatus that each easily allows achievement of measures for EMC.

An electronic device substrate according to a first aspect of the invention includes an insulating plate base, an electronic circuit formed on one surface of the base, and a conductive film formed on the other surface of the base and having electrical conductivity. The electronic device substrate is completed through a manufacturing process including charge-removal movement in which removal of a charge of the base is combined with movement of the electronic device substrate. In the charge-removal movement, the electronic device substrate is moved with being supported by a substrate support part that has electrical conductivity and is grounded. The substrate support part abuts the conductive film during the charge-removal movement.

According to the first aspect, even when the electronic device substrate is charged in the manufacturing process thereof, the charge can be immediately discharged through the conductive film and the substrate support part, which can prevent charging of the electronic device substrate. Accordingly, adverse effects due to static electricity, such as breakdown of thin-film transistors and thin-film diodes in the electronic circuit, and absorption of dusts in the air to the substrate, can be prevented. Thus, the electronic device substrate of high yield and high quality can be provided.

In particular, since the conductive film is brought into contact with the substrate support part and thus the whole conductive film is grounded, a grounded region having a wide area can be ensured. Therefore, a high charge-removal effect is achieved, which can surely prevent charging of the electronic device substrate. Accordingly, the above-described advantages can surely be achieved under any manufacturing condition.

In the electronic device substrate according to the first aspect, it is preferable that a ground of the electronic circuit is electrically coupled to the conductive film.

This electrical coupling allows effective use of the conductive film as a measure for ensuring EMC when the electronic device substrate is used as a product. Therefore, achievement of measures for EMC is allowed at low costs.

In the electronic device substrate according to the first aspect, processing for the electronic device substrate is preferably implemented in association with movement of the electronic device substrate in the charge-removal movement.

Thus, even in processing that easily causes charging of the electronic device substrate, the occurrence of adverse effects due to static electricity can be surely prevented, which further enhances the yield and quality.

In the electronic device substrate according to the first aspect, it is preferable that the processing is application of a certain pattern on the one surface of the base, and the application is implemented by moving the electronic device substrate relative to a droplet discharge head that discharges as a droplet a liquid material for forming a film.

Thus, in patterning by use of an ink jet method, the occurrence of adverse effects due to static electricity can surely be prevented, which further enhances the yield and quality.

In the electronic device substrate according to the first aspect, the conductive film is preferably formed on the entire periphery or on part of the periphery of the other surface of the base.

Thus, the conductive film is unobtrusive in the electronic device substrate, which decreases the possibility of occurrence of adverse effects due to the conductive film.

The electronic device substrate according to the first aspect, the conductive film preferably has a part that is formed into a strip extending along the movement direction of the electronic device substrate in the charge-removal movement.

Thus, even when the electronic device substrate is moved in the charge-removal movement, the contact between the conductive film and substrate support part can surely be maintained, which offers a further higher charge-removal effect.

In the electronic device substrate according to the first aspect, after the charge-removal movement, the base is preferably divided into a plurality of substrates by being cut along a cut line in a strip region on which the conductive film is formed.

Thus, the conductive film is positioned on an edge of the divided electronic device substrate. Therefore, the conductive film is unobtrusive, which decreases the possibility of occurrence of adverse effects due to the conductive film.

In the electronic device substrate according to the first aspect, the conductive film is preferably formed by applying a liquid material that contains a conductive particle on the other surface of the base with use of a droplet discharge head for discharging the liquid material as a droplet, and solidifying or curing the liquid material.

Thus, the conductive film having a desired pattern can be formed accurately and easily. In addition, the conductive film can be formed at low costs with less waste of the material.

In the electronic device substrate according to the first aspect, the conductive film is preferably formed on such a position that, if the electronic device substrate is mounted in a casing for housing the electronic device substrate, the conductive film is brought into contact with an electrically conductive coating formed on the inside surface of the casing.

Thus, the coating on the inside surface of the casing functions as a shield for blocking electromagnetic waves and electric fields, and therefore can contribute to achievement of EMC.

An electronic device according to a second aspect of the invention includes the electronic device substrate according to the first aspect, a casing that houses the electronic device substrate and has an electrically conductive coating formed on the inside surface of the casing. The electronic device substrate is housed in the casing so that the conductive film is brought into contact with the coating on the inside surface of the casing.

According to the second aspect, the coating on the inside surface of the casing functions as a shield for blocking electromagnetic waves and electric fields, and therefore can contribute to achievement of EMC.

In the electronic device according to the second aspect, it is preferable that a ground of the electronic circuit of the electronic device substrate is electrically coupled to the conductive film so that the ground of the electronic circuit is electrically coupled to the coating on the inside surface of the casing.

If the coating on the inside surface of the casing is electrically coupled via the conductive film to the ground of the electronic circuit, the coating on the inside surface of the casing is provided with an improved shielding performance, and therefore contributes to achievement of EMC more effectively.

A method of manufacturing an electronic device according to a third aspect of the invention, includes completing an electronic device substrate that has an insulating-plate base and an electronic circuit formed on one surface of the base, through a manufacturing process including movement of the electronic device substrate in association with removal of a charge of the base. The electronic device substrate has a conductive film that is formed on part of the other surface of the base and has electrical conductivity. In the movement, the electronic device substrate is moved with being supported by a substrate support part that has electrical conductivity and is grounded. The substrate support part abuts the conductive film during the movement. The method also includes mounting the electronic device substrate in a casing that has an electrically conductive coating formed on the inside surface of the casing, so that the conductive film is brought into contact with the coating on the inside surface of the casing.

According to the third aspect, even when the electronic device substrate is charged in the manufacturing process thereof, the charge can be immediately discharged through the conductive film and the substrate support part, which can prevent charging of the electronic device substrate. Accordingly, adverse effects due to static electricity, such as breakdown of thin-film transistors and thin-film diodes in the electronic circuit, and absorption of dusts in the air to the substrate, can be prevented. Thus, the electronic device substrate of high yield and high quality can be provided.

In addition, after the electronic device substrate is mounted in the casing so as to provide a product electronic device, the coating on the inside surface of the casing functions as a shield for blocking electromagnetic waves and electric fields, and therefore can contribute to achievement of EMC.

An electronic apparatus according to a fourth aspect of the invention includes the electronic device according to the third aspect.

The fourth aspect can provide a high yield and high quality electronic apparatus that allows achievement of measures for ensuring EMC at low costs.

BRIEF DESCRIPTION OF THE DRAWINGS

The invention will be described with reference to the accompanying drawings, wherein like numbers reference like elements.

DESCRIPTION OF EXEMPLARY EMBODIMENTS

An electronic device substrate, an electronic device, a method of manufacturing an electronic device, and an electronic apparatus will be described below in detail based on preferred embodiments of the invention, with reference to the accompanying drawings.

Figure 1:
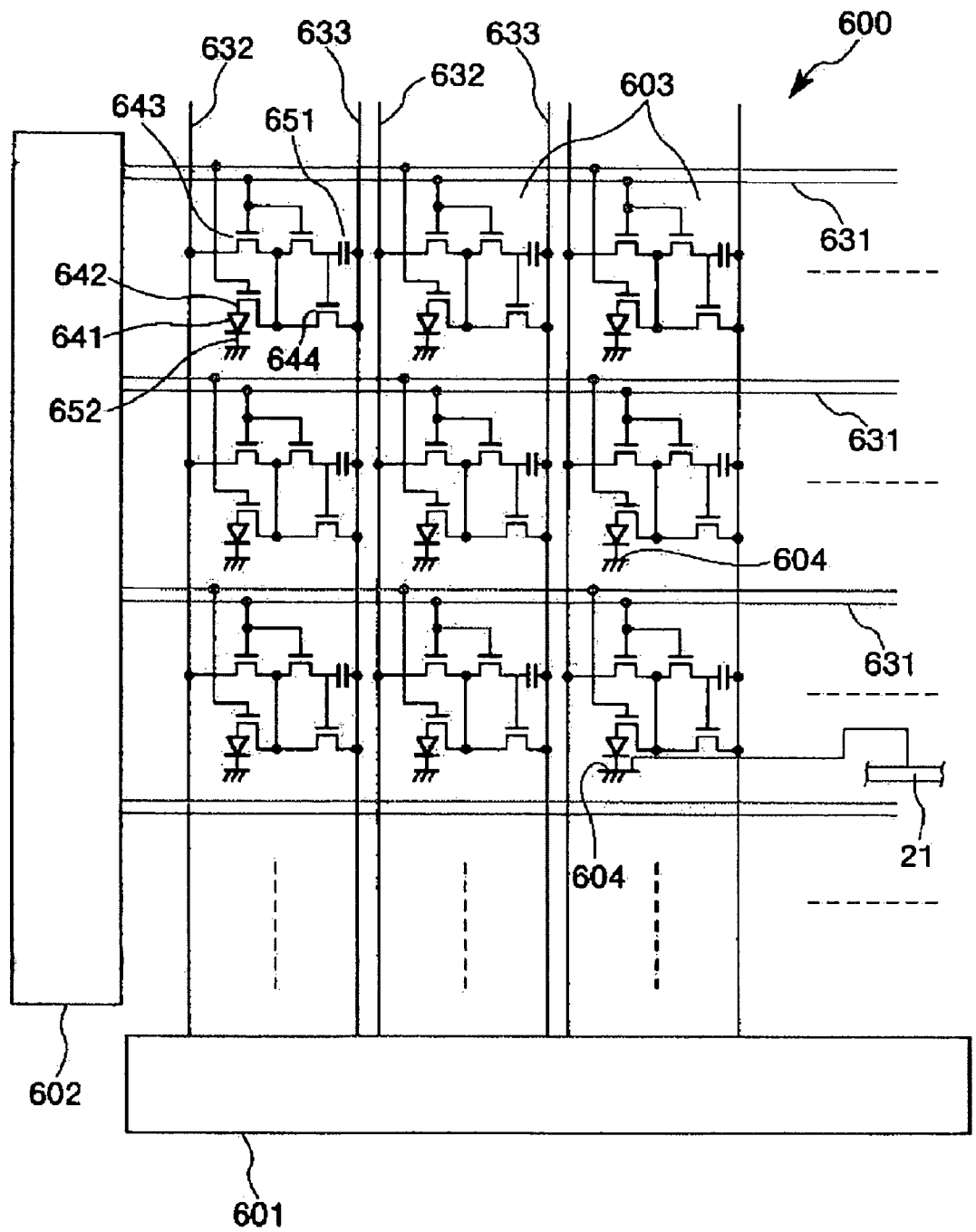
FIG. 1 is a circuit diagram illustrating, as an embodiment of the invention, an electronic device substrate applied to an organic EL panel.

FIGS. 1, 2A, 2B, and 3C to 3E are diagrams illustrating, as one embodiment of the invention, an electronic device substrate applied to an organic EL panel. FIG. 1 is a circuit diagram. FIGS. 2A, 2B and 3C to 3E are sectional views illustrating steps for forming a luminescent film. Hereinafter, the completed (semi-completed) organic EL panel in FIG. 3E and the organic EL panels that have not been completed yet in FIGS. 2A to 3D are all referred to as an organic EL panel 2 in common.

The organic EL panel 2 shown in these drawings includes a plate base 621, and an electronic circuit 600 shown in FIG. 1 formed on one surface of the base 621. The base 621 is an insulating plate member composed of an insulating material such as glass or plastic.

Referring to FIG. 1, the organic EL panel 2 is provided with a plurality of scan lines 631, a plurality of signal lines 632 extending in the direction perpendicular to the scan lines 631, and a plurality of common power feed lines 633 extending in parallel to the signal lines 632. In addition, a pixel region 603 is provided at each of the intersections between the scan lines 631 and the signal lines 632.

Provided for the signal lines 632 is a data drive circuit 601 that includes a shift register, a level shifter, a video line and an analog switch. Provided for the scan lines 631 is a scan drive circuit 602 that includes a shift register and a level shifter.

Each pixel region 603 includes a switching thin-film transistor (TFT) 643 of which gate electrode is supplied with a scan signal via the scan line 631, a hold capacitor 651 that holds an image signal supplied from the signal line 632 via the switching TFT 643, and a current TFT 644 of which gate electrode is supplied with the image signal held by the hold capacitor 651. In addition, each pixel region 603 also includes a pixel electrode 642, and a luminescent film (luminescent layer) 641 interposed between the pixel electrode 642 and a reflection electrode 652. A drive current flows from the common power feed line 633 into the pixel electrode 642 when the pixel electrode 642 is electrically coupled via the current TFT 644 to the common power feed line 633.

The operation in the organic EL panel 2 is as follows. When the scan line 631 is driven and thus the switching TFT 643 is turned on, the potential at the signal line 632 at this time is held by the hold capacitor 651. The state of the hold capacitor 651 determines the ON/OFF state of the current TFT 644. Subsequently, a current flows from the common power feed line 633 to the pixel electrode 642 through the channel of the current TFT 644. This current further flows through the luminescent film 641 to the reflection electrode 652. Thus, the luminescent film 641 emits light according to the amount of current flowing therethrough.

Figure 3C:
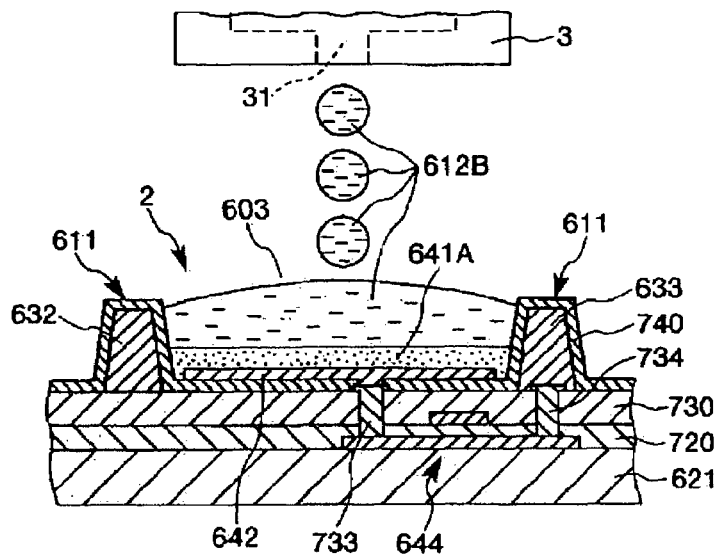
FIGS. 3C to 3E are sectional views illustrating forming steps for a luminescent film of the electronic device substrate applied to an organic EL panel according to the embodiment.
Figure 3D:
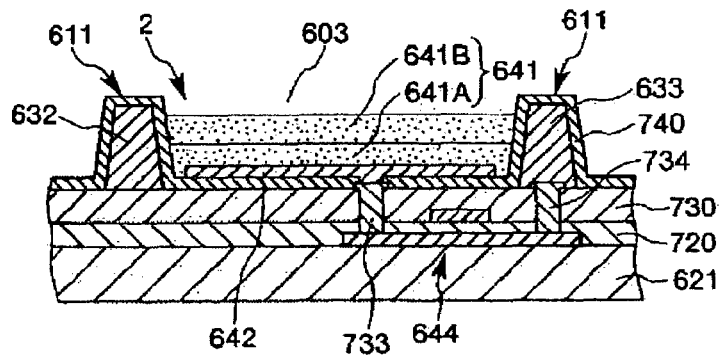
Figure 3E:
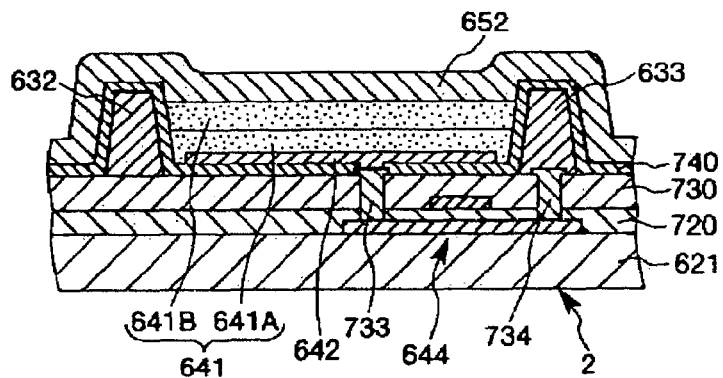

As shown in FIG. 3E, the organic EL panel 2 further includes a gate insulating film 720, an interlayer insulating film 730, intermediate electrodes 733 and 734, and an interlayer insulating film 740.

In the organic EL panel 2 of the present embodiment, banks 611 surrounding the pixel regions 603 (the luminescent films 641) are formed by utilizing interconnects such as the signal lines 632 and the common interconnects 633. However, the invention is not limited to such a structure, but the banks 611 may be formed without utilizing interconnects such as the signal lines 632 and the common interconnects 633.

The luminescent films 641 in the organic EL panel 2 are formed by an ink jet method. Steps for forming the luminescent film 641 will be described below with reference to FIGS. 2A, 2B and 3C to 3E.

Figure 2A:
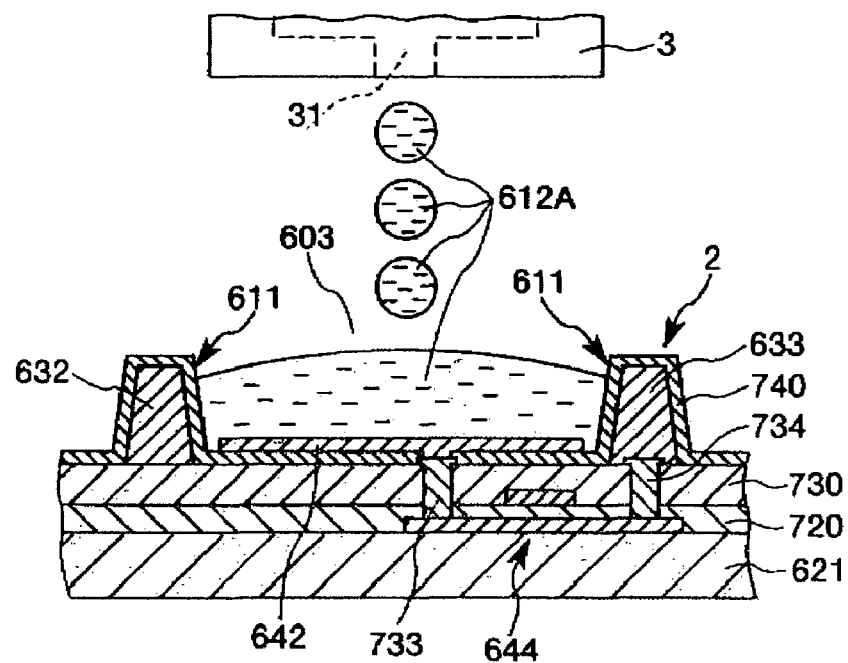
FIGS. 2A and 2B are sectional views illustrating forming steps for a luminescent film of the electronic device substrate applied to an organic EL panel according to the embodiment.

Referring to FIG. 2A, by using a droplet discharge head (ink jet head) 3, droplets of a liquid material 612A are discharged from a nozzle 31 of the droplet discharge head 3. Thus, the liquid material 612A is applied in each pixel region 603 surrounded by the banks 611. The liquid material 612A is prepared by dissolving (or dispersing) in a solvent (or a dispersion medium) a material for forming a hole injection layer 641A, which corresponds to the lower layer part of the luminescent film 641.

As the droplet discharge head 3, a publicly known ink jet head can be used. Any of a piezoelectric actuator, an electrostatic actuator, an electrothermal transducer is available as a drive element in the head 3.

Figure 2B:
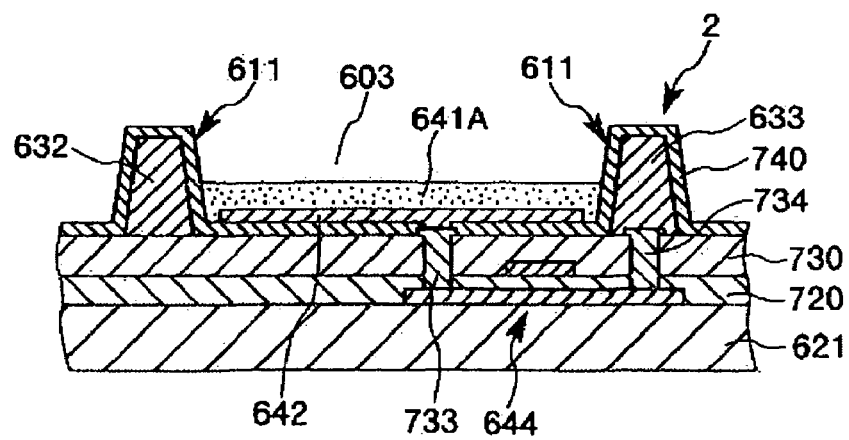

After the application of the liquid material 612A in the pixel region 603, the organic EL panel 2 is heated or is irradiated with light. Thus, the solvent or dispersion medium in the liquid material 612A in the pixel region 603 is evaporated, to thereby solidify or cure the liquid material 612A. Thus, the hole injection layer 641A is formed on the pixel electrode 642 as shown in FIG. 2B. Note that repeating the steps of FIGS. 2A and 2B according to need allows formation of the hole injection layer 641A having a desired thickness.

Subsequent to the formation of the hole injection layer 641A, another film is formed on the hole injection layer 641A. Specifically, referring to FIG. 3C, by using another droplet discharge head 3 similar to the foregoing head 3, droplets of a liquid material 612B are discharged from a nozzle 31 of this droplet discharge head 3. Thus, the liquid material 612B is applied in each pixel region 603 surrounded by the banks 611. The liquid material 612B is prepared by dissolving (or dispersing) in a solvent (or a dispersion medium) an organic fluorescent material for forming an organic semiconductor film 641B, which corresponds to the upper layer part of the luminescent film 641.

After the application of the liquid material 612B in the pixel region 603, the organic EL panel 2 is heated or is irradiated with light. Thus, the solvent or dispersion medium in the liquid material 612B in the pixel region 603 is evaporated, to thereby solidify or cure the liquid material 612B. Thus, the organic semiconductor film 641B is formed over the pixel electrode 642 as shown in FIG. 3D. Note that repeating the steps of FIGS. 3C and 3D according to need allows formation of the organic semiconductor film 641B having a desired thickness.

After the luminescent films 641 are formed through the above-described steps, the reflection electrode 652 is formed over the entire surface, or formed in a strip manner over the surface. Thus, the organic EL panel 2 is completed (semi-completed).

Note that the hole injection layer 641A may be absent from the luminescent film 641 although the absence thereof lowers the emission efficiency (hole injection efficiency) to some extent. Furthermore, instead of forming the hole injection layer 641A, an electron injection layer may be formed between the organic semiconductor film 641B and the reflection electrode 652. Alternatively, both the hole injection layer and electron injection layer may be formed.

Figure 4:
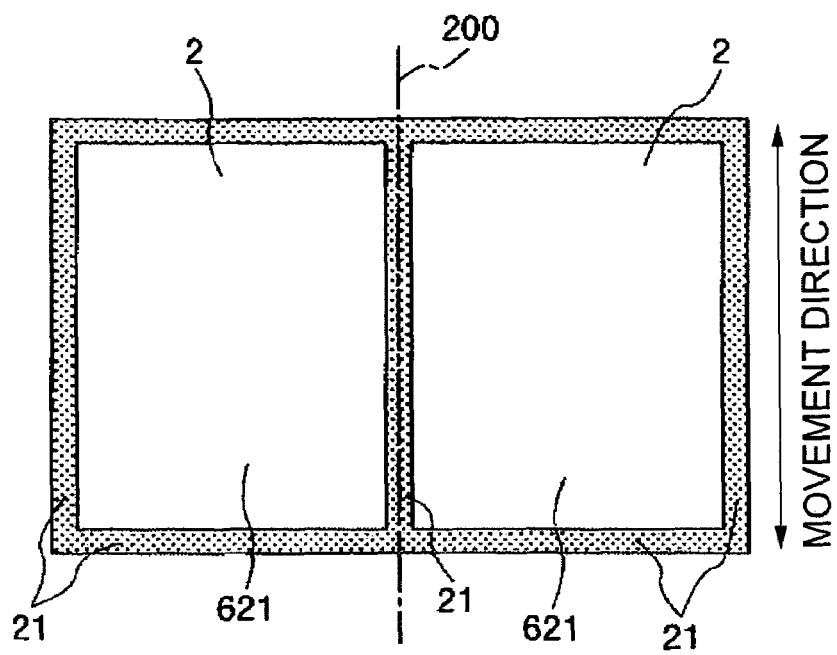
FIG. 4 is a diagram illustrating the backside of an organic EL panel.

FIG. 4 is a diagram illustrating the backside of the organic EL panel 2.

The organic EL panel 2 of the present embodiment is to be used as a display of a large-screen television. Two organic EL panels 2 are manufactured from one base 621. Specifically, after the electronic circuit 600, the luminescent films 641 and so on are formed over the base 621, the base 621 is cut along a cut line 200 indicated by the chain line in FIG. 4, so as to be divided into two panels. Each of the divided panels serves as one organic EL panel 2.

As shown in FIG. 4, on the backside of the base 621, i.e., on the surface opposite to the surface having thereon the electronic circuit 600, conductive films 21 having electrical conductivity are formed. For improved visibility, the formation regions of the conductive films 21 are indicated by dotted areas in FIGS. 4 and 5. That is, the dotted areas in FIGS. 4 and 5 do not indicate a section.

Any substance is available as the material of the conductive films 21 as long as it has electrical conductivity. However, it is preferable to use a transparent material such as indium tin oxide (ITO). The use of a transparent material can surely prevent the conductive films 21 from causing adverse effects when the organic EL panel 2 is put into practical use as a product.

The formation position of the conductive films 21 is not particularly limited. In the present embodiment, as shown in FIG. 4, the conductive films 21 are formed into strips on the periphery of the base 621 that has not been cut yet, and at the position along the cut line 200. Alternatively, like organic EL panels 2' shown in FIG. 5, the conductive films 21 may be formed only at the position along the cut line 200 and near edges of the sides parallel to the cut line 200.

Figure 6:
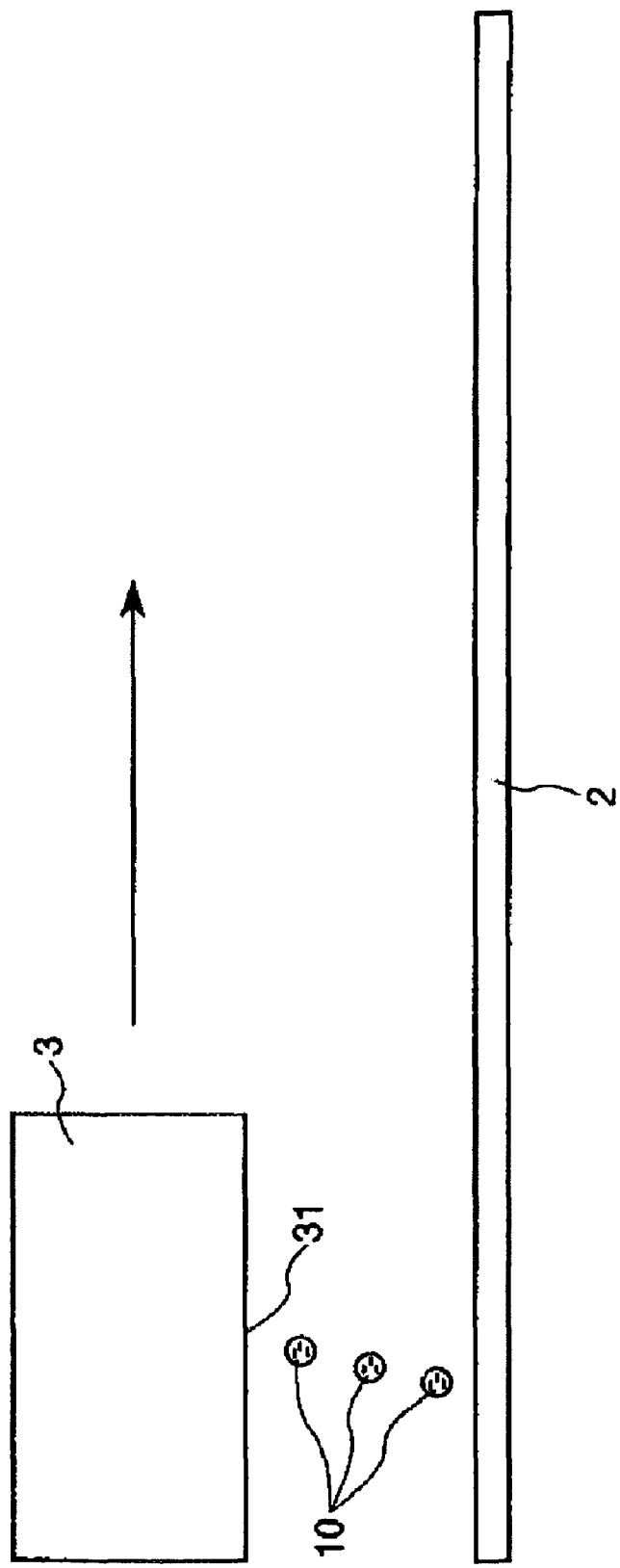
FIG. 6 is a side view for explaining a method for forming a conductive film on the backside of a base of an organic EL panel by use of an ink jet method.

FIG. 6 is a side view for explaining a method for forming the conductive films 21 on the backside of the base 621 of the organic EL panel 2 by use of an ink jet method. One example of the method for forming the conductive films 21 will be described below with reference to FIG. 6.

A liquid material (a dispersion liquid) is prepared by dispersing, in a dispersion medium, conductive particles composed of a conductive material such as ITO. Droplets 10 of this liquid material are discharged from a nozzle 31 of a publicly known droplet discharge head 3 similar to the foregoing head, while moving the droplet discharge head 3 relative to the organic EL panel 2. Thus, the liquid material is pattern-applied on the backside of the organic EL panel 2 (the base 621). Subsequently, the dispersion medium in the pattern-applied liquid material is evaporated by drying, to thereby solidify or cure the liquid material, which results in the formation of the conductive films 21 on the backside of the organic EL panel 2 (the base 621).

When an ink jet method is used to form the conductive films 21 as described above, the conductive films 21 with a desired pattern can be formed accurately and easily. In addition, the conductive films 21 can be formed at low costs with less waste of the material.

The forming method of the conductive films 21 is not limited to the ink jet method. The conductive films 21 may be formed by using vapor deposition, ion plating, sputtering or another deposition method.

Figure 7:
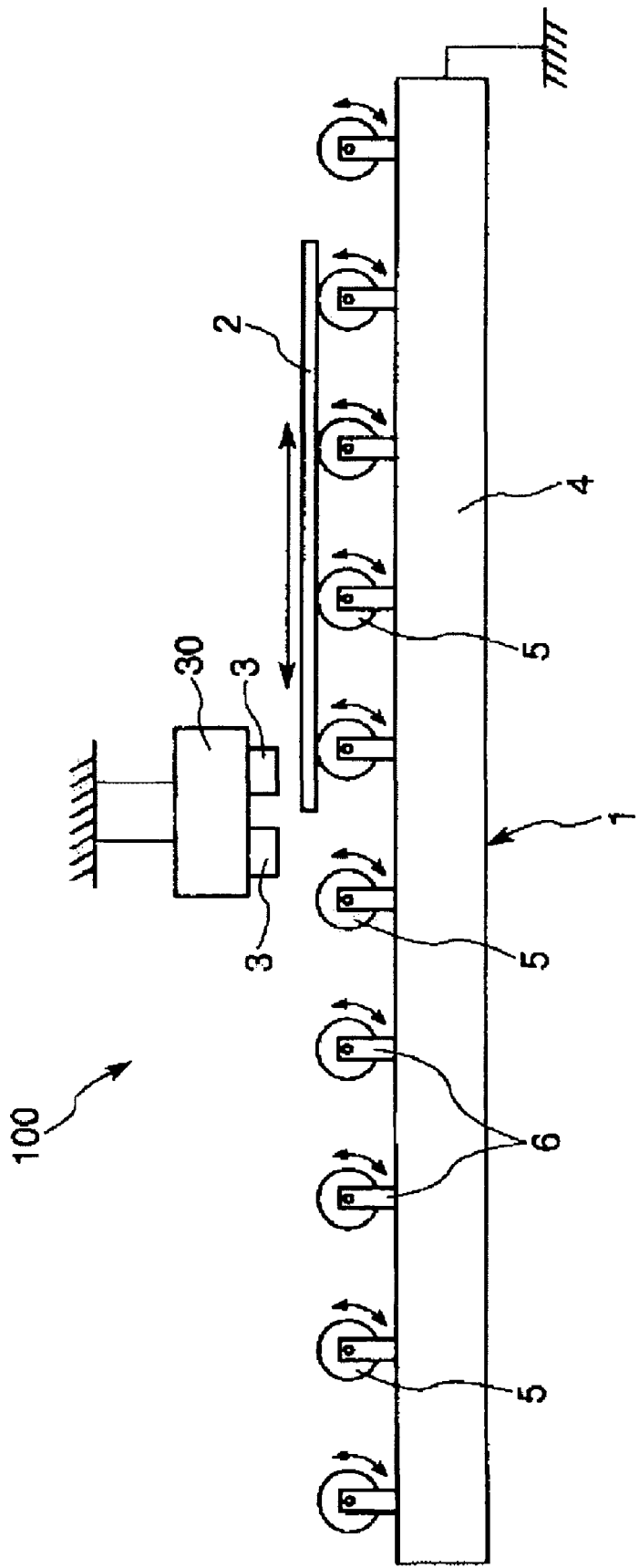
FIG. 7 is a side view illustrating an ink jet patterning device for forming a luminescent film of an organic EL panel.
Figure 8:
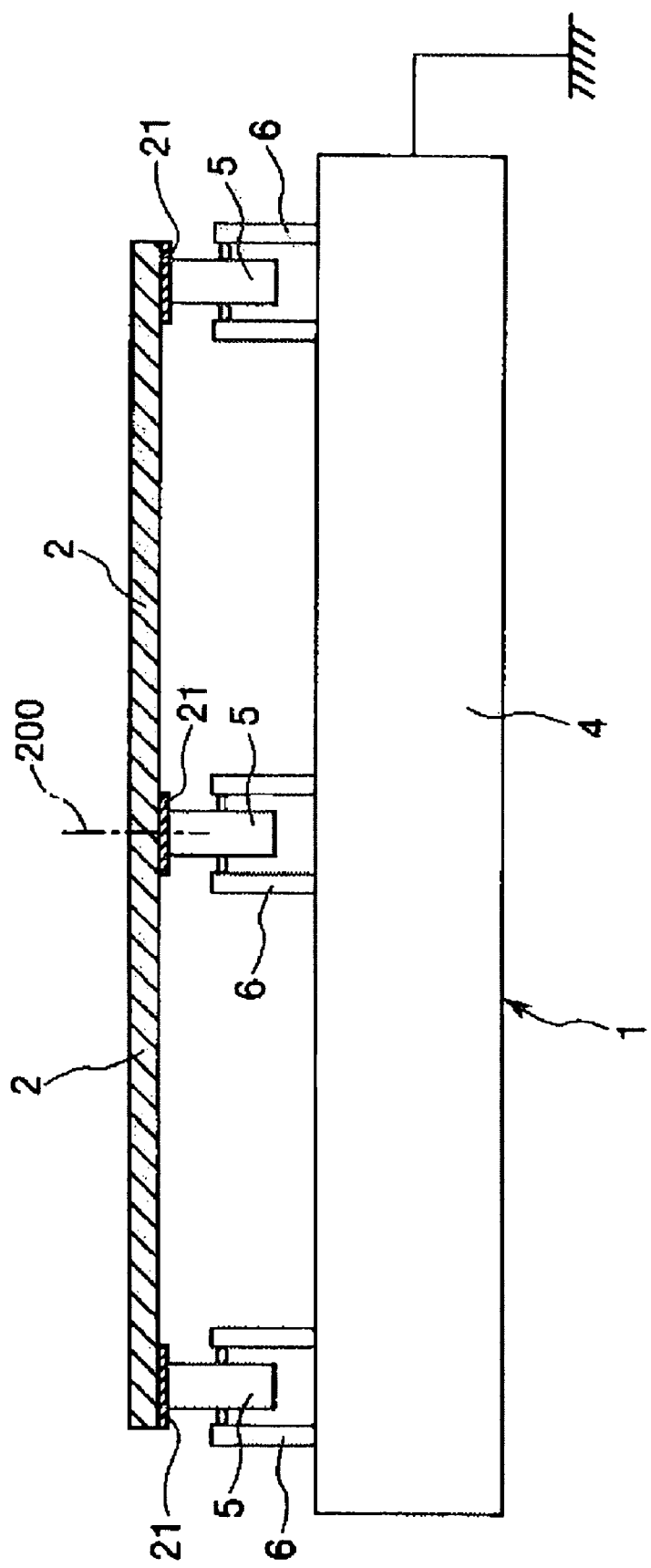
FIG. 8 is a front view illustrating a substrate moving unit in the inkjet patterning device shown in FIG. 7.

FIG. 7 is a side view illustrating an ink jet patterning device for forming the luminescent films 641 of the organic EL panel 2. FIG. 8 is a front view illustrating a substrate moving unit in the ink jet patterning device shown in FIG. 7.

The pattern-application (patterning) of the liquid materials 612A and 612B for forming the luminescent films 641, described with FIGS. 2A and 3C, is carried out with use of an ink jet patterning device 100 in FIG. 7.

Referring to FIG. 7, the ink jet patterning device 100 includes a head carriage 30 having one or more droplet discharge heads 3, and a substrate moving unit 1 for moving the organic EL panel 2. In the ink jet patterning device 100, the operation of the substrate moving unit 1 moves the organic EL panel 2 that has not been divided into two panels yet under the head carriage 30 in the direction parallel to the plane of the panel 2. In association with this panel movement, droplets of the liquid materials 612A and 612B are discharged from nozzles 31 of the droplet discharge head 3. Thus, pattern-application (patterning) of the liquid materials is implemented.

The step of FIG. 2A and the step of FIG. 3C may be separately carried out by use of different ink jet patterning devices 100. Alternatively, by providing the head carriage 30 with both the droplet discharge head 3 for discharging the liquid material 612A and another droplet discharge head 3 for discharging the liquid material 612B, the both steps may be carried out with use of a common ink jet patterning device 100.

The substrate moving unit 1 included in the ink jet patterning device 100 has a main body 4, and a plurality of rollers 5 provided over the main body 4. Each roller 5 is rotatably supported by a roller support 6. The organic EL panel 2 is placed on these rollers 5. That is, a substrate support part in the substrate moving unit 1 is formed of the rollers 5. The rollers 5 are driven to roll by a motor (not shown), which moves the organic EL panel 2 in the left and right directions in FIG. 7.

FIG. 8 is a diagram obtained when viewing the substrate moving unit 1 from the direction parallel to the movement direction of the organic EL panel 2. Referring to FIG. 8, the rollers 5 are arranged in three rows. The rollers 5 in the respective rows support the formation regions of the conductive films 21 on the organic EL panel 2 that has not been divided into two panels yet.

At least the vicinities of surfaces of the main body 4, the rollers 5 and the roller supports 5 are composed of a conductive material such as a metal, metal powder, metal compound, or carbon black. In addition, electrical conduction is allowed between the main body 4 and the roller supports 6, and between the roller supports 6 and the rollers 5. The main body 4 is coupled to the ground (earth). Thus, the rollers 5 are grounded via the roller supports 6 and the main body 4.

Typically, when pattern-application (patterning-processing) is carried out by an ink jet method for an electronic device substrate like the organic EL panel 2, charging of the electronic device substrate is easily caused. The reason therefore is that droplets discharged from the nozzles 31 of the droplet discharge head 3 are charged when they are separated from the nozzles 31, and therefore charges are accumulated in the electronic device substrate as the number of droplets landing on the electronic device substrate increases.

In contrast, in the embodiment of the invention, pattern-application is carried out while moving the organic EL panel 2 by use of the substrate moving unit 1. Therefore, even when the base 621 of the organic EL panel 2 is charged, the charge can be immediately discharged through the conductive films 21 and the rollers 5, which can prevent charging of the base 621. Accordingly, adverse effects due to static electricity, such as breakdown of TFTs and thin-film diodes in the electronic circuit 600, and absorption of dusts in the air to the substrate, can be prevented. Thus, the yield and quality of products can be enhanced in fabrication of the organic EL panel 2.

In particular, in the embodiment of the invention, the conductive films 21 are brought into contact with the rollers 5, and thus the whole conductive films 21 are grounded, which ensures a grounded region having a wide area. Therefore, a high charge-removal effect is achieved, which can surely prevent charging of the base 621. Accordingly, the above-described advantages can surely be achieved under any condition.

In addition, the conductive films 21 in the present embodiment include a part that is formed into strips extending along the movement direction of the organic EL panel 2 on the substrate moving unit 1, and this part is brought into contact with the rollers 5. Thus, even when the organic EL panel 2 is moved on the substrate moving unit 1, the contact between the conductive films 21 and the rollers 5 can surely be maintained, which can offer a further higher charge-removal effect.

Furthermore, in the present embodiment, the conductive film 21 is formed on a region including the cut line 200 for dividing the organic EL panel 2 into two organic EL panels 2 as described above. Therefore, after the division into two organic EL panels 2, the conductive films 21 are positioned at edges of the divided organic EL panels 2, so that the conductive films 21 are unobtrusive, which reduces the possibility of occurrence of adverse effects due to the conductive films 21.

Figure 5:
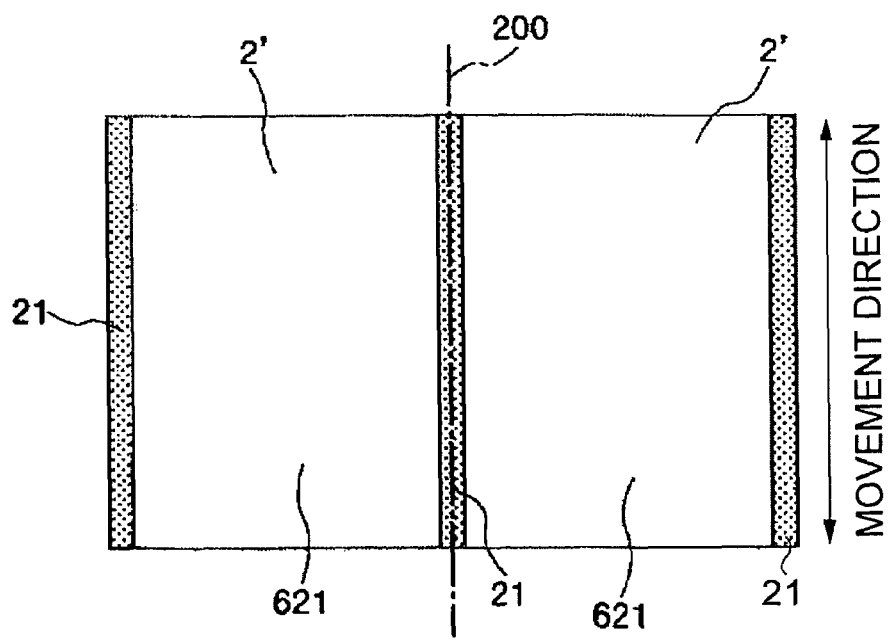
FIG. 5 is a diagram illustrating the backside of an organic EL panel.

In the example shown in FIGS. 4 and 5, the number of the strip conductive films 21 formed in parallel to the movement direction of the organic EL panel 2 is three. However, the number of the strip conductive films is not limited thereto. In the case of dividing one panel into a large number of panels, like the case of e.g. fabrication of organic EL panels for cellular phones, the number of cut lines for the division from one panel is correspondingly large, and therefore the number of the conductive films 21 may be increased.

The step of moving the organic EL panel 2 by use of the substrate moving unit 1 of the ink jet patterning device 100 in the present embodiment corresponds to the charge-removal movement.

In embodiments of the invention, use of the charge-removal movement is not limited to movement of a substrate at the time of pattern-application by an ink jet method. The charge-removal movement may be applied to any movement of a substrate in the manufacturing process for an electronic device substrate. For example, the charge-removal movement may be applied to movement of an electronic device substrate in any processing such as a thin-film formation processing based on a method other than an ink jet method, a patterning processing, a surface treatment processing, and machine processing. Furthermore, the charge-removal movement is not limited to movement at the time of processing, but may be used in transfer of an electronic device substrate among a plurality of manufacturing devices, specifically e.g. in transfer of an electronic device substrate from the ink jet patterning device 100 to a drying device (not shown).

The substrate moving unit for implementing the charge-removal movement may have any structure. For example, a structure like any of those shown in FIGS. 9 and 10 is also available.

Figure 9:
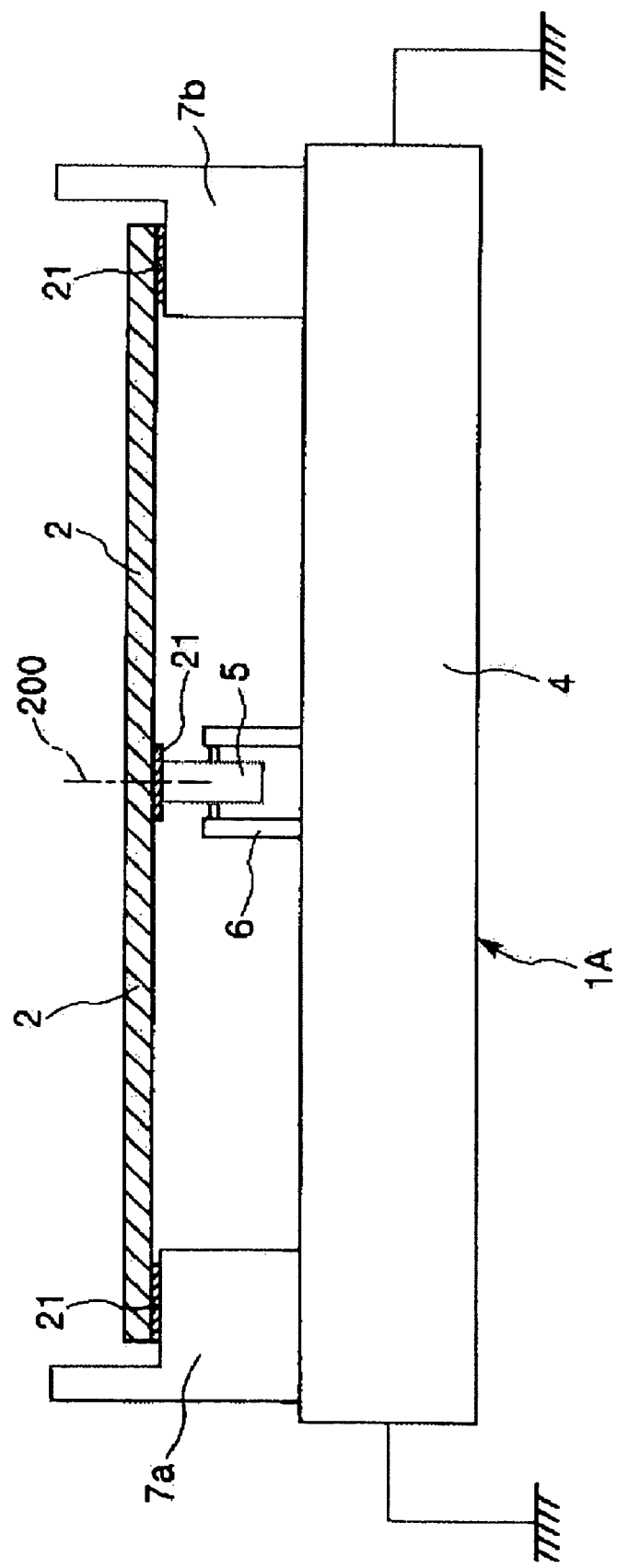
FIG. 9 is a front view illustrating another configuration example of a substrate moving unit.
Figure 10:
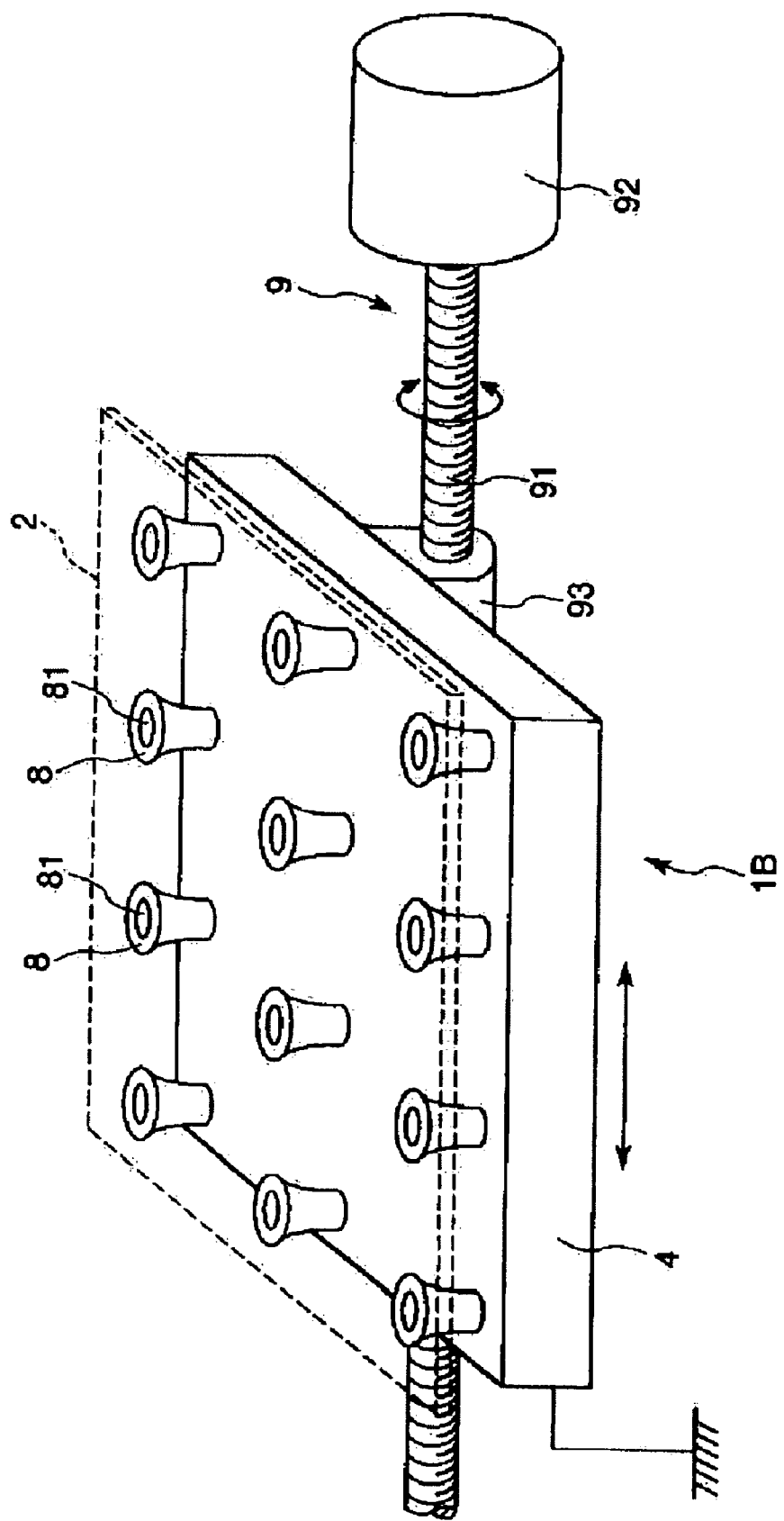
FIG. 10 is a front view illustrating still another configuration example of a substrate moving unit.

A substrate moving unit 1A shown in FIG. 9 is equivalent to a unit obtained by substituting guide rails 7a and 7b for, of three rows of the rollers 5 on the substrate moving unit 1 in FIGS. 7 and 8, two rows other than the center row. In the substrate moving unit 1A, the guide rails 7a and 7b also function as a substrate support part. When the organic EL panel 2 is transferred due to rolling of the rollers 5 in the center row, the both sides of the organic EL panel 2 slide on the guide rails 7a and 7b. Thus, the organic EL panel 2 is guided so as to advance straight in the movement direction.

At least the vicinities of surfaces of the guide rails 7a and 7b are composed of a conductive material such as a metal, metal powder, metal compound, or carbon black. In addition, electrical conduction is allowed between the main body 4 and the guide rails 7a and 7b. The main body 4 is coupled to the ground (earth). Thus, the guide rails 7a and 7b are grounded via the main body 4.

In the substrate moving unit 1A, even when the base 621 of the organic EL panel 2 under transfer is charged, the charge can be immediately discharged through the conductive films 21 and the guide rails 7a and 7b. Therefore, the same advantages as those of the above-described embodiment can be achieved.

A substrate moving unit 1B shown in FIG. 10 includes the main body 4, a plurality of suction parts 8 provided on the main body 4, and a movement mechanism 9 for moving the main body 4. In the substrate moving unit 1B, the suction parts 8 function as a substrate support part.

The suction parts 8 are provided so as to protrude from the top face of the main body 4. A suction opening 81 is formed in the top end surface of each of the suction parts 8. Formed inside the main body 4 is a suction channel (not shown) that communicates with each suction opening 81. This suction channel is coupled to a vacuum pump (not shown). Due to the operation of the vacuum pump, the organic EL panel 2 disposed on the suction parts 8 is vacuum-sucked, which allows fixing thereof to the main body 4.

The movement mechanism 9 includes a lead screw 91, a motor 92 for rotating the lead screw 91, and a threaded part 93 into which the lead screw 91 is screwed. The rotation of the lead screw 91 caused by driving of the motor 92 allows movement of the main body 4 in the left and right directions in the drawing. Thus, the organic EL panel 2 can be transferred.

At least the vicinities of surfaces of the suction parts 8 are composed of a conductive material such as a metal, metal powder, metal compound, or carbon black. In addition, electrical conduction is allowed between the main body 4 and the suction parts 8. The main body 4 is coupled to the ground (earth). Thus, the suction parts 8 are grounded via the main body 4.

In the substrate moving unit 1B, even when the base 621 of the organic EL panel 2 under transfer is charged, the charge can be immediately discharged through the conductive films 21 and the suction parts 8. Therefore, the same advantages as those of the above-described embodiment can be achieved.

Figure 11:
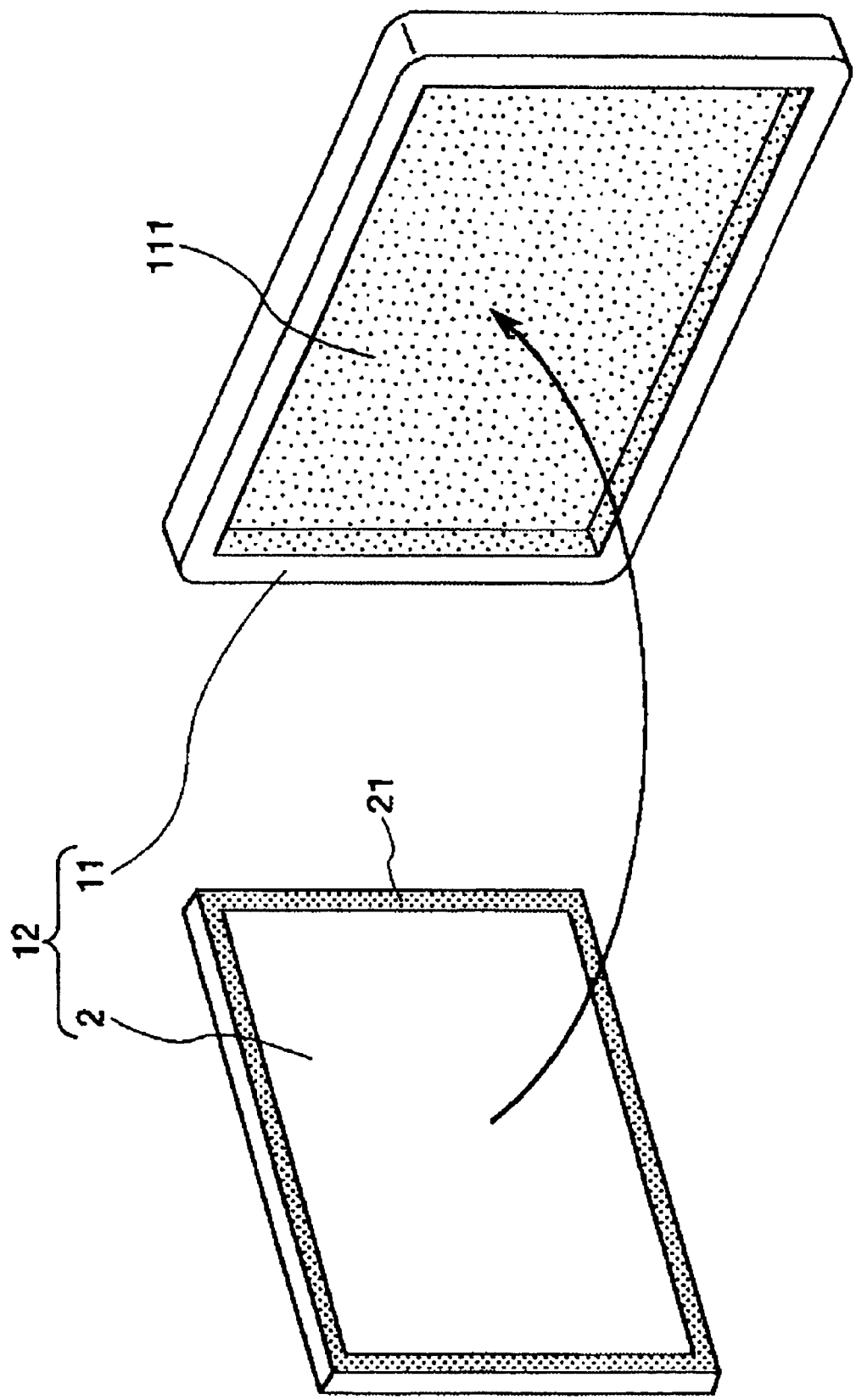
FIG. 11 is an exploded perspective view of an organic EL display that includes an organic EL panel and a casing in which the organic EL panel is housed.

FIG. 11 is an exploded perspective view of an organic EL display that includes the organic EL panel 2 and a casing 11 in which the organic EL panel 2 is housed.

As shown in FIG. 11, the organic EL panel 2 is mounted in the casing 11 that is composed of a plastic material and has a shallow recess shape, and thus an organic EL display 12 is constructed. Formed on the surface of the recess of the casing 11 is an electrically conductive coating 111. For improved visibility, the formation regions of the conductive film 21 and the coating 111 are indicated by dotted areas in FIG. 11. There is no particular limitation on a method of forming the coating 111 on the inside surface of the casing 11. For example, application of a Ag paste easily allows the formation thereof.

In the state in which the organic EL panel 2 is mounted in the casing 11, the coating 111 of the casing 11 is in contact with the conductive film 21 on the backside of the organic EL panel 2. As shown in FIG. 1, in the organic EL panel 2, a ground 604 of the electronic circuit 600 is electrically coupled to the conductive film 21, which offers electrical conduction therebetween. Therefore, in the organic EL display 12, the coating 111 of the casing 11 is electrically coupled to the ground 604 of the electronic circuit 600 via the conductive film 21. Thus, the coating 111 of the casing 11 effectively functions as a shield for blocking electromagnetic waves and electric fields, and therefore can contribute to achievement of EMC.

Figure 12:
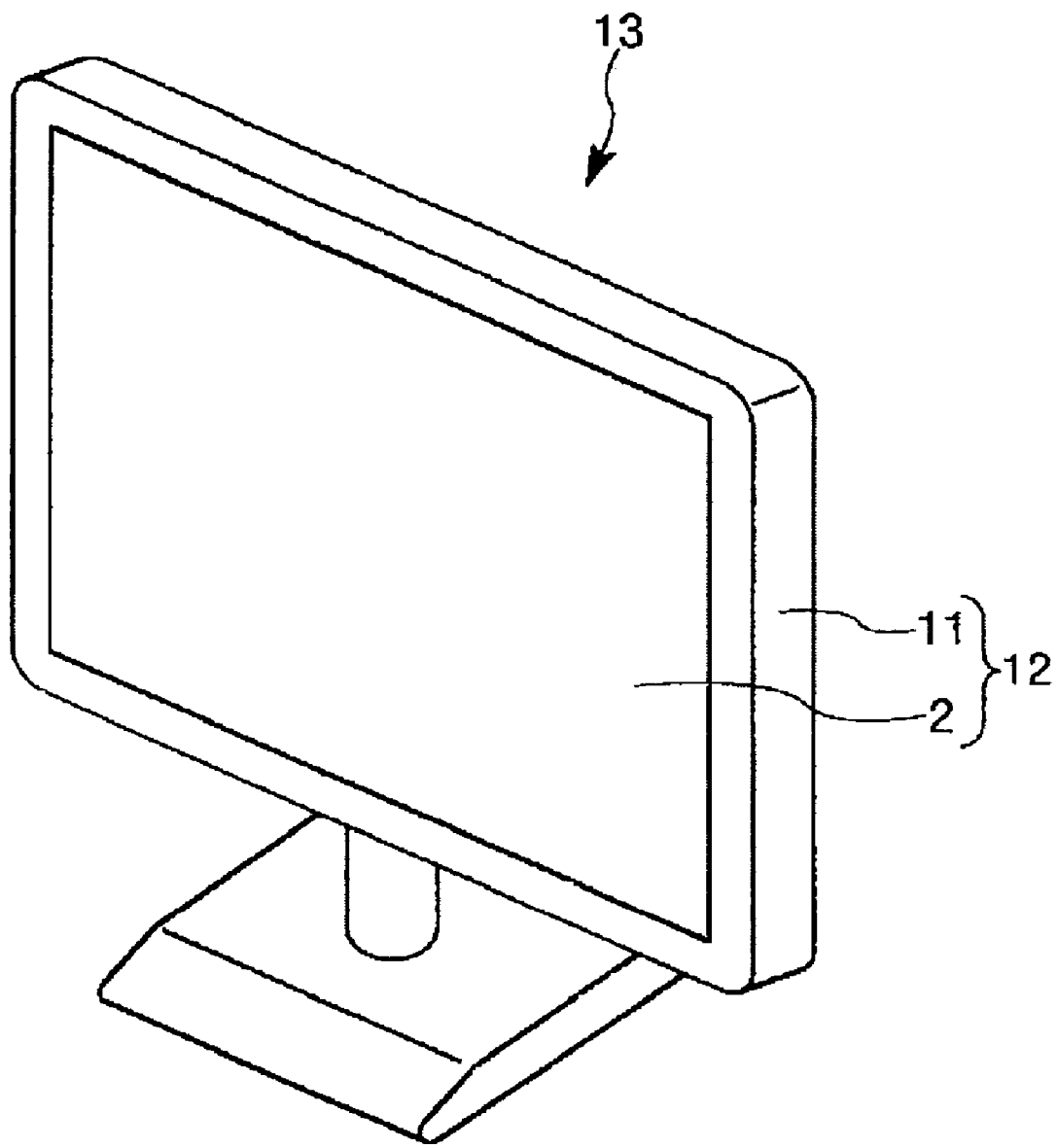
FIG. 12 is a perspective view illustrating a flat-screen television that includes the organic EL display shown in FIG. 11.

FIG. 12 is a perspective view illustrating a flat-screen television 13 that includes the organic EL display 12 shown in FIG. 11. As shown in this drawing, the organic EL display 12 in FIG. 11 can be applied to the flat-screen television 13 or the like.

As described above, in the manufacturing process for the organic EL panel 2, the conductive films 21 prevent adverse effects due to static electricity, and thus contribute to enhancement of the yield and quality of products. Furthermore, after completion of products such as the organic EL display 12 and the flat-screen television 13, the conductive films 21 function to electrically couple the ground 604 of the electronic circuit 600 in the organic EL panel 2 with the coating 111 on the inside surface of the casing 11. Thus, the coating 111 can be used as a shield effectively, which contributes to achievement of EMC.

In the above description, illustrations and explanations have been made about an electronic device substrate, an electronic device, a method of manufacturing an electronic device and an electronic apparatus as embodiments of the invention. However, the invention is not limited thereto.

In addition, in the above-described embodiments, an electronic device substrate is applied to an organic EL panel. However, the invention is not limited thereto but can be applied to any of various electronic device substrates such as liquid crystal panels, electrophoretic display panels, plasma display panels, and electronic circuit boards.

Furthermore, the electronic device according to an embodiment of the invention is not limited to an organic EL display. The invention can be applied to various electronic devices such as liquid crystal displays, electrophoretic displays and PDP displays.

Moreover, an electronic apparatus according to an embodiment of the invention is not limited to a flat-screen television. The invention can be applied to the following applications: notebook or desktop personal computers; cellular phones; digital cameras; car navigation devices; pagers; electronic notebooks; electronic dictionaries; electronic calculators; electronic game apparatuses; word processors; work stations; television phones; security television monitors; electronic binoculars; POS terminals; apparatuses with a touch panel (e.g. cash dispensers in financial institutions and automatic ticket machines); medical apparatuses (e.g. electronic thermometers, blood-pressure manometers, blood glucose meters, electrocardiogram display devices, ultrasonographs, and endoscopic display devices); fish detectors; various measurement apparatuses; gauges (e.g. gauges in vehicles, airplanes and ships); flight simulators; other various monitors; projection displays such as projectors; and so forth.

The charge-removal movement in embodiments of the invention may be combined with any of publicly known other charge-removal methods. Examples of other charge-removal methods include the following methods: a method of spraying an ionized gas disclosed in JP-A-5-243187; a method of spraying a high moisture gas disclosed in JP-A-7-733991 and JP-A-7-130488; a method of supplying a charge-removal gas from a plurality of apertures disclosed in JP-A-2001-7187; a method of applying a polishing solution disclosed in JP-A-2001-343632; and a method of using soft X-rays disclosed in JP-A-2004-311048.

What is claimed is:

1. An electronic device substrate comprising:
   an insulating plate base with a first terminal end and a second terminal end;
   an electronic circuit formed on one surface of the base; and
   a conductive film formed on the other surface of the base and having electrical conductivity, wherein:
   the electronic device substrate is completed through a manufacturing process including charge-removal movement in which removal of a charge of the base is combined with movement of the electronic device substrate;
   in the charge-removal movement, the electronic device substrate is moved while being supported by a roller that has electrical conductivity and is grounded, wherein the roller abuts the conductive film and rolls to moveably support the electronic device substrate during the charge-removal movement;
   the conductive film extends continuously about an entire periphery of the other surface of the base; and
   the conductive film has a part that is formed into a stripe extending continuously from the first terminal end to the second terminal end and along the movement direction of the electronic device substrate in the charge-removal movement.

2. The electronic device substrate according to claim 1, wherein a ground of the electronic circuit is electrically coupled to the conductive film.

3. The electronic device substrate according to claim 1, wherein in the charge-removal movement, processing for the electronic device substrate is implemented in association with movement of the electronic device substrate.

4. The electronic device substrate according to claim 3, wherein the processing is application of a certain pattern on the one surface of the base, and the application is implemented by moving the electronic device substrate relative to a droplet discharge head that discharges as a droplet a liquid material for forming a film.

5. The electronic device substrate according to claim 1, wherein after the charge-removal movement, the base is divided into a plurality of substrates by being cut along a cut line in a strip region on which the conductive film is formed.

6. The electronic device substrate according to claim 1, wherein the conductive film is formed by applying a liquid material that contains a conductive particle on the other surface of the base with use of a droplet discharge head for discharging the liquid material as a droplet, and solidifying or curing the liquid material.

7. The electronic device substrate according to claim 1, wherein the conductive film is formed on such a position that, if the electronic device substrate is mounted in a casing for housing the electronic device substrate, the conductive film is brought into contact with an electrically conductive coating formed on the inside surface of the casing.

8. An electronic device comprising:
   the electronic device substrate according to claim 1;
   a casing that houses the electronic device substrate and has an electrically conductive coating formed on the inside surface of the casing, wherein the electronic device substrate is housed in the casing so that the conductive film is brought into contact with the coating on the inside surface of the casing.

9. The electronic device according to claim 8, wherein a ground of the electronic circuit of the electronic device substrate is electrically coupled to the conductive film so that the ground of the electronic circuit is electrically coupled to the coating on the inside surface of the casing.

10. A method of manufacturing an electronic device, comprising:
    completing an electronic device substrate that has an insulating plate base and an electronic circuit formed on one surface of the base, through a manufacturing process including movement of the electronic device substrate in association with removal of a charge of the base, the electronic device substrate having a conductive film that extends continuously about an entire periphery of the other surface of the base and has electrical conductivity, the conductive film has a part that is formed into a stripe extending continuously from a first terminal end of the insulating plate base to a second terminal end of the insulating plate base, the electronic device substrate being moveably supported by a roller that has electrical conductivity and is grounded, the roller rolling while abutting the stripe of the conductive film during the movement; and mounting the electronic device substrate in a casing that has an electrically conductive coating formed on the inside surface of the casing, so that the conductive film is brought into contact with the coating on the inside surface of the casing.

11. An electronic apparatus comprising the electronic device according to claim 8.

12. The electronic device substrate of claim 1, wherein the conductive film extends continuously between at least two stripes in a direction that is substantially parallel to the first and second terminal ends.

13. The electronic device substrate of claim 5, wherein the conductive film is formed continuously along both sides of the cut line.

14. The method of manufacturing of claim 10, wherein the conductive film extends continuously between at least two stripes in a direction that is substantially parallel to the first and second terminal ends.

15. The method of manufacturing of claim 10, further comprising dividing a plurality of substrates along a cut line, wherein the conductive film is formed continuously along both sides of the cut line.

16. The electronic device substrate of claim 1, wherein the stripe has a width that is greater than a width of the roller.

17. The method of manufacturing of claim 10, wherein the stripe has a width that is greater than a width of the roller.

* * * * *